United States Patent [19]

Lenck et al.

[11] Patent Number: 4,960,141

[45] Date of Patent: Oct. 2, 1990

[54] DEVICE FOR CLEANING IN PARTICULAR OF DISC-SHAPED OXIDE SUBSTRATES

[75] Inventors: Norbert Lenck, Rodenbach; Jörg Wörner, Grosskrotzenburg, both of Fed. Rep. of Germany

[73] Assignee: Nukem GmbH, Hanau, Fed. Rep. of Germany

[21] Appl. No.: 249,986

[22] Filed: Sep. 27, 1988

[30] Foreign Application Priority Data

Oct. 6, 1987 [DE] Fed. Rep. of Germany ....... 3733670

[51] Int. Cl.$^5$ ................................................ B08B 7/04
[52] U.S. Cl. ..................................... 134/61; 134/105; 134/135
[58] Field of Search ........................ 134/61, 76, 83, 90, 134/102, 105, 135; 15/302

[56] References Cited

U.S. PATENT DOCUMENTS 2,057,177 10/1936 Wolff ............................... 134/105 X
4,694,527 9/1987 Yoshizawa ......................... 134/61 X

FOREIGN PATENT DOCUMENTS 1149222 5/1963 Fed. Rep. of Germany ........ 134/61
0010069 1/1977 Japan .................................. 134/105
0161826 9/1984 Japan .................................. 134/90
2084865 4/1982 United Kingdom ................ 134/105

Primary Examiner—Philip R. Coe
Attorney, Agent, or Firm—Beveridge, DeGrandi & Weilacher

[57] ABSTRACT

A method and a device for cleaning in particular of oxide substrates is proposed, the substrates being extracted from a quantity of extremely pure water after pre-cleaning. The temperature of the substrate and the extraction velocity from the water are so selected that a water film extending from the water surface runs off evenly.

6 Claims, 1 Drawing Sheet

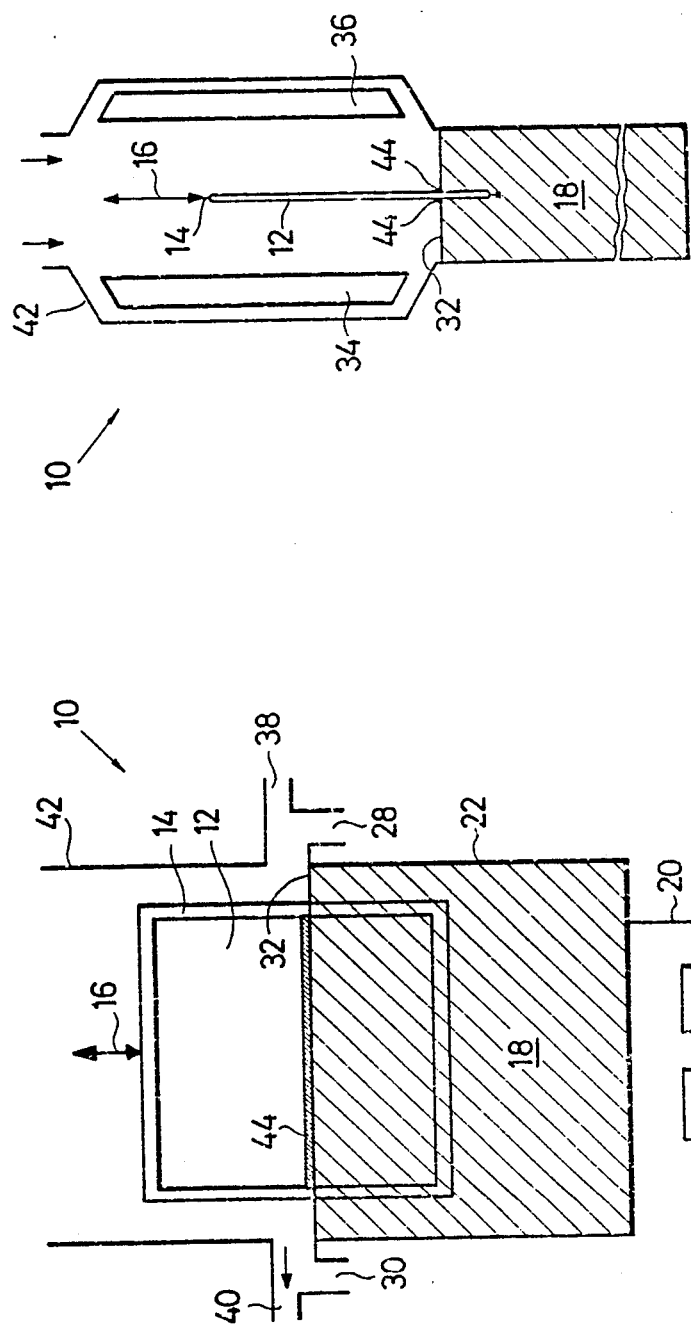

DEVICE FOR CLEANING IN PARTICULAR OF DISC-SHAPED OXIDE SUBSTRATES

DESCRIPTION

The invention relates to a method and a device for cleaning in particular of disc-shaped oxide substrates such as glass, where the substrate passes through at least one cleaning stage and one drying stage.

If oxide substrates, for example glasses, are to have electrical, optical or functional layers deposited on them, organic and anorganic impurities adhering to the substrates must be removed beforehand. There are substantially two methods of achieving this. It is known, for example, how to convey disc-shaped glasses on rollers through a brush section, where water containing surface-active agents and then de-ionized water is sprayed onto the surfaces in several cleaning stages. The surfaces are blow-dried to remove residual liquid. The drawback of this method is that the substrates have to be conveyed against the pressure of the brushes by suitable devices, so that conveyor elements such as rollers for passing the discs through the devices must be pressed firmly against the discs. Handling of this type causes residues on the surfaces. To eliminate this drawback, DE-GM 85 25 160 proposes that the substrates be conveyed substantially in an upright position through the cleaning stages. It is however not possible with appropriate technically complicated measures to ensure that the surfaces are sufficiently cleaned by the mechanical effect of the brush ends, since the liquids to be sprayed on are not necessarily by themselves adequate to remove impurities. In the subsequent drying stage, air is guided substantially vertically onto the surface of the substrates. This results in swirling that enables, contrary to the desired aim, impure particles to be deposited back onto the surface. In consequence, air cleaning stations entailing considerable expense to operate must be provided to prevent particle contamination.

On the other hand, it is possible to clean the substrates in various baths with ultrasonics and surface-active agents—usually in a high concentration. A rinse with organic solvents then follows to remove water. Drying takes place in a halogenated hydrocarbon steam bath. This process has the drawback that large surface-active agent residues adhere to the substrate surfaces and can only be completely removed with difficulty, so that adhesion problems arise for the layers to be deposited. In addition, the use of halogenated hydrocarbons is becoming more difficult due to environmental considerations alone, since very thorough exhaust removal is required for reasons of workplace safety. As a result, major invenstment costs are entailed by waste air cleaning and the recovery of halogenated hydrocarbons from the bath losses and waste steam losses from dried substrates. Furthermore, expensive disposal of the waste solvents must be ensured, as these must be brought to high temperatures.

The object underlying the invention is to further develop a method and a device of the type mentioned at the outset so that the substrates are cleaned in a manner meeting the requirements in full, without drying residues or run-off traces occurring. At the same time, halogenated hydrocarbons should not be used.

The object is attained in accordance with the invention by extracting the substrate from a water quantity after precleaning, in such a way that a coherent film of moisture extending to the surface of the water runs off the surface of the substrate. The substrate can, prior to immersion in the water quantity, be pre-cleaned in a solution with low surface-active agent content, if necessary in an ultrasonic bath. Within the water quantity itself, the substrate is set to a required temperature $T_1$, where $T_1$ is preferably between 50° C. and 95° C., particularly between 60° C. and 80° C. Once the substrate has assumed the temperature and is extracted from the water quantity with velocities preferably between 0.1 mm/sec and 10 mm/sec, a coherent water film is formed that runs evenly off the surface. This gives optimum results particularly if it is ensured that extraction is substantially vertical to the water surface.

The surface of the water quantity itself is kept at a constant level during extraction of the substrate, in order to avoid any fluctuation due to the change in water displacement that might have a detrimental effect on formation of the water film. The substrate is heated, mainly by IR heaters, on both sides preferably directly above the water surface, thereby ensuring that condensation of steam onto the substrate surface does not occur. This is supported by a gas flowing along the substrate surface, particularly by high-purity air of laminar flow.

A device for implementation of the method described above in particular is distinguished by the device comprising a water quantity inside a container, by the container having at least one lateral overflow, by the water quantity being connected to a water supply, by at least two heater elements being arranged at a distance from one another above the water quantity, between which the substrate is movable, and by the device having a supply means for high-purity air flowing along the substrate. The elements are preferably arranged in a housing. Two overflows arranged diametrically to the substrate can be provided that can extend from ducts via which the air flowing over the substrate can be removed. If the area above the water quantity is not enclosed by a housing, the water quantity should be located in a clean room or in a flow workplace.

The water supplying the water quantity is extremely pure (de-ionized water) that is circulated through the water quantity and preheated. A filter device is provided inside the circuit to retain particles causing contamination.

With the method according to the invention, it is possible to clean pre-cleaned substrates solely with water, with optimum results being achieved as regards surface cleanness compared to known methods.

Further details, advantages and features of the invention are given not only in the claims, and the features—singly in combination—to be found therein, but also in the following description of a preferred embodiment shown in the drawing.

FIG. 1 shows a sectional side view of a device for cleaning substrate, and

FIG. 2 shows a longitudinal section through the device according to FIG. 1.

The figures show a device (10) in which disc-shaped substrates (12) are to be cleaned. The substrates (12) are preferably oxide substrates, for example glass. The substrate (12) is mounted in a holder such as the frame (14), in order to be extracted from a water quantity (18) in the direction shown by the arrow (16). The liquid quantity is high-purity water (DI water) supplied to a container (22) via a line (20). The line (20) contains both a heater (24) and a filter device (26). The container (22), such as a basin, has in the embodiment 2 overflows (28) and (30) arranged diametrically to the substrate (12) and preferably running in the plane formed by the substrate (12). The water passing through the overflows (28) and (30) passes to the circuit of line (20). The overflows (28) and (30) ensure that the surface (32) of the water quantity (18) is always at the same level.

At the side of the substrate (12) above the surface (32) are heater elements, in particular IR heaters (34) and (36). High-purity gas such as air is supplied from the top of the device and flows between the IR heaters (34) and (36) along the surface of the substrate (12), to be removed via the ducts (38) and (40) from which the overflows (28) and (30) also extend.

As the drawing indicates, the elements described about are accommodated in a housing (42). This is however not neccessarily required; instead the container (22) with the water quantity (18) can also be arranged in a clean room or in a flow workplace.

To clean the substrate (12), it is first pre-cleaned in a solution containing surface-active agents and preferably in an ultrasonic bath. Then the substrate (12) is immersed completely in the water quantity (18). The water quantity itself is set to a required temperature $T_1$ preferably between 50° C. and 95° C., particularly between 60° C. and 80° C. As soon as the substrate (12) has reached the temperature $T_1$, it is extracted from the high-purity water in the direction of the arrow (16). The extraction velocities to be indicated are between 0.1 mm/sec and 10 mm/sec. When these parameters are complied with, and even water film (44) forms on both sides of the substrate and extends from the water surface (32). The water film (44) runs evenly off the surface of the substrate (12) without rupturing, thereby ensuring that the substrate (12) is cleaned to the extent required for subsequent deposition of, for example, electrical, optical or functional layers. To ensure that the stream above the water quantity (18) does not condense on the cleaned surface of the substrate (12), heating takes place directly above the water surface (32) to a temperature above that of the water quantity (18). This heat is provided by IR heaters (34) and (36) arranged on both sides of the substrate (12). This means of preventing condensation from forming on the surface is supported by the high-purity air of laminar flow passing along the substrate surface and being removed via the ducts (38) and (40).

With the device according to the invention it is also of course possible to clean not only oxide substrates, but also non-oxide ones. The latter is possible when corrosion from the water quantity can be ruled out. This can be achieved by adjusting the pH value.

An already pre-cleaned substrate can also be subjected to this method. Pre-cleaning can be carried out by a manufacturer of the substrate, for example.

We claim:

1. A device for cleaning a disc-shaped substrate such as glass, comprising:
   a container holding a water quantity for cleaning said substrate, said container having an overflow for maintaining the surface of said water quantity at an essentially constant level, irrespective of immersion of said substrate in said water quantity;
   a water supply connected to said container for feeding water thereto;
   a holder adapted to extract said substrate substantially-vertically out of said water quantity;
   heating elements arranged above said water quantity and spaced apart to allow said substrate to pass therebetween; and
   an air feed arranged above said water quantity for flowing air along said substrate.

2. A device according to claim 1 wherein said heater elements are enclosed in a housing that accommodates said container.

3. A device according to claim 1 wherein two overflows are provided and arranged diametrically to said substrate, said two overflows extending from ducts via which said air is removed.

4. A device according to claim 1 wherein said water fed to said water quantity circulates through said container to said overflow and into said water supply.

5. A device according to claim 1 wherein said water quantity has a temperature $T_1$ greater than 50° C. and less than 95° C.

6. A device according to claim 1 wherein said water quantity consists of highly cleaned water.

* * * * *